(12) United States Patent
Faver

(10) Patent No.: US 6,550,022 B1
(45) Date of Patent: Apr. 15, 2003

(54) HIERARCHICAL JTAG BASED CHECKSTOP ARCHITECTURE FOR COMPUTER SYSTEMS

(75) Inventor: David Lloyd Faver, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/431,796

(22) Filed: Nov. 2, 1999

(51) Int. Cl.[7] .................................................. G06F 11/26
(52) U.S. Cl. ............................ 714/34; 714/31; 717/129
(58) Field of Search ....................... 714/34, 31; 717/129

(56) References Cited

U.S. PATENT DOCUMENTS

| | | | | |
|---|---|---|---|---|
| 4,852,095 A | * | 7/1989 | Meltzer ........................ | 714/34 |
| 5,355,468 A | * | 10/1994 | Jeppesen et al. .............. | 714/34 |
| 5,423,050 A | * | 6/1995 | Taylor et al. .................. | 714/31 |
| 5,687,329 A | * | 11/1997 | Kaiser et al. ................. | 710/310 |
| 6,119,246 A | * | 9/2000 | McLaughlin et al. ......... | 714/34 |
| 6,223,305 B1 | * | 4/2001 | Simmons et al. ............. | 714/34 |
| 6,389,557 B1 | * | 5/2002 | Yu et al. ....................... | 714/34 |

OTHER PUBLICATIONS

Barrios et al., Scientific Applications in RS/6000 SP Environments, Dec. 1999, IBM Corp., First Edition, pp. 3–7.*

* cited by examiner

Primary Examiner—Robert Beausoliel
Assistant Examiner—Michael Maskulinski
(74) Attorney, Agent, or Firm—Mark E. McBurney; Bracewell & Patterson, L.L.P.

(57) ABSTRACT

A checkstop architecture allows an entire computer system to be immediately halted when a failure(s) or error(s) has occurred at a chip, component, device, sub-system, etc. The present checkstop architecture provides a way of preserving and later providing the state of the computer system at failure or error. The checkstop architecture utilizes a single-wire checkstop that provides a way for quickly stopping all chips in the system and a JTAG that provides a way for querying the error registers in determining which chip pulled checkstop first and what had occurred to cause the error. The present system and method also utilizes a service processor, various computer devices, and at least one central checkstop collection location. The occurrence of the checkstop at one of the computer devices is detected by its internal checkstop operation. The occurrence of the checkstop is driven to the at least one central checkstop collection location, all other of the computer devices, and the service processor. A single-wire checkstop provides a way for all chips of the entire computer system to be halted when the occurrence of the checkstop has been detected. Error registers of the chips are then queried via a separate JTAG to identify the chip which first pulled checkstop and what caused the error. The service processor captures the state of the entire computer system at the time of checkstop occurrence and determines the initial source of the checkstop by tracing back from the central checkstop collection chip.

12 Claims, 3 Drawing Sheets

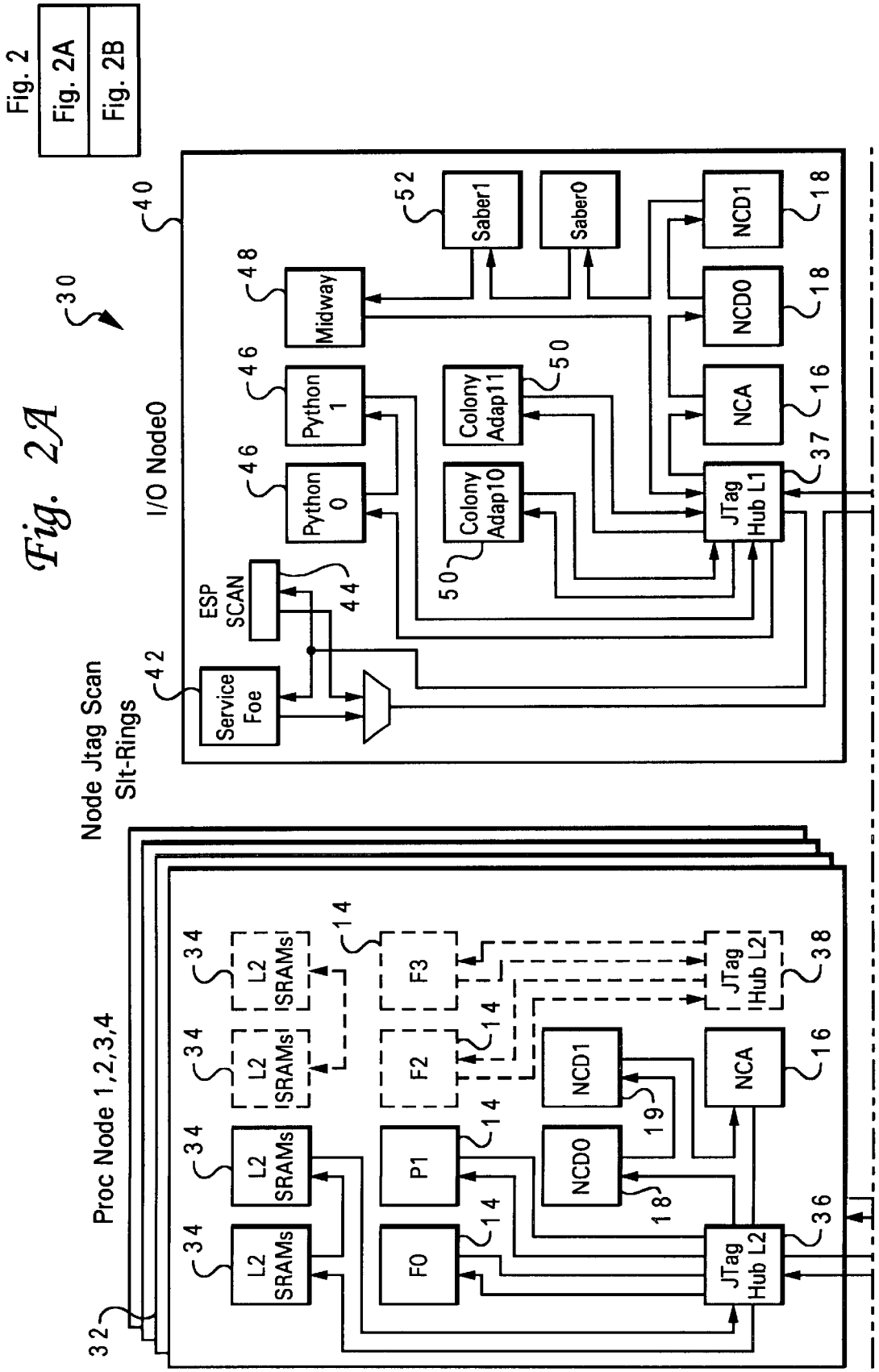

HIERARCHICAL JTAG BASED CHECKSTOP ARCHITECTURE FOR COMPUTER SYSTEMS

BACKGROUND OF THE INVENTION

1. Technical Field:

The present invention relates in general to a checkstop architecture for analyzing and debugging errors or failures of systems or sub-systems and in particular to a hierarchical JTAG based checkstop architecture for analyzing and debugging errors or failures in computer systems.

2. Description of the Related Art:

Analyzing and debugging errors and failures are often difficult to accomplish in large, complex computer systems such as in International Business Machine's (IBM's) RS6000 workstation. Such complex systems are so widely distributed with numerous key chips, components, and sub-systems that a failure or error that has occurred in one chip, component, or sub-system of the computer system is not realized or recognized by other chips, components, or sub-systems in the computer system. Oftentimes, the entire computer system is not promptly or immediately stopped or halted when such a failure(s) or error(s) has occurred. Thus, the computer system continues to operate and execute even though an error or failure has occurred in at least one of the chips, components, or sub-systems. Also, such present computer systems do not provide an easy way for identifying, locating, and debugging the error(s) or failure(s) that has or have occurred and the source of the error(s) or failure(s). Furthermore, such present computer systems do not provide a way of preserving the state of the system at failure or error so that a complete and accurate state of the entire computer system is provided at the time of failure or error occurrence.

All key chips in such complex computer systems (i.e. RS6000 workstation) include bi-directional checkstop logic. A checkstop is a fatal error that must be handled as quickly as possible. An example of such a fatal error is a parity error. A processor may have detected a non-correctable parity error in a cache memory. Since the parity is bad and a parity error has occurred, a checkstop is triggered so that the error is able to be immediately handled. Other IBM systems have used checkstop to freeze all processor states in multiprocessor systems for each of the processors in the overall computer system. However, a checkstop architecture has not been used for an entire and overall computer system, particularly a complex computer system. Also, a checkstop tree architecture for an entire and overall computer system does not exist wherein the checkstop tree is able to be walked and used to efficiently isolate and identify an error or failure and its location.

Additionally, Joint Test Action Group (JTAG) architectures and features on chips are well known in the art. JTAG is separate and distinct from checkstops. The JTAG architectures and features provide accessibility to error registers on each chip. Access to these error registers allow for the implementation of various error/failure checking, verification, and debugging operations. Thus, the JTAG architectures and features provide secondary or ancillary backdoors into chips.

It is therefore advantageous and desirable to provide a checkstop architecture for an entire and overall computer system, particularly a complex computer system. It is also advantageous and desirable to provide a checkstop architecture for an entire and overall computer system wherein the computer system is promptly or immediately stopped or halted when such a failure(s) or error(s) has occurred within the computer system such as at a chip, component, or sub-system. It is further advantageous and desirable to provide a way of preserving the state of an entire computer system at failure or error so that a complete and accurate state of the entire computer system at the time of failure or error occurrence is still able to be provided. It is still further advantageous and desirable to provide an easy way of identifying, locating, and debugging the error(s) or failure(s) that has or have occurred within an overall computer system and the source of the error(s) or failure(s). It is still also advantageous and desirable to provide a checkstop architecture that utilizes a single-wire checkstop that provides a way for quickly stopping all chips in the system and a JTAG bus that provides a way for querying the error registers in determining which chip pulled checkstop first and what had occurred to cause the error.

SUMMARY OF THE INVENTION

It is therefore one object of the present invention to provide a checkstop architecture for an entire and overall computer system, particularly a complex computer system.

It is another object of the present invention to provide a checkstop architecture for an entire and overall computer system wherein the computer system is promptly or immediately stopped or halted when such a failure(s) or error(s) has occurred within the computer system such as at a chip, component, or sub-system.

It is a further object of the present invention to provide a way of preserving the state of an entire computer system at failure or error so that a complete and accurate state of the entire computer system at the time of failure or error occurrence is still able to be provided.

It is still another object of the present invention to provide an easy way of identifying, locating, and debugging the error(s) or failure(s) that has or have occurred within an overall computer system and the source of the error(s) or failure(s).

It is still also a further object of the present invention to provide a checkstop architecture that utilizes a single-wire checkstop that provides a way for quickly stopping all chips in the system and a JTAG bus that provides a way for querying the error registers in determining which chip pulled checkstop first and what had occurred to cause the error.

The foregoing objects are achieved as is now described. A checkstop architecture allows an entire computer system to be immediately halted when a failure(s) or error(s) has occurred at a chip, component, device, sub-system, etc.. The present checkstop architecture provides a way of preserving and later providing the state of the computer system at failure or error. The checkstop architecture utilizes a single-wire checkstop that provides a way for quickly stopping all chips in the system and a JTAG that provides a way for querying the error registers in determining which chip pulled checkstop first and what had occurred to cause the error. The present system and method also utilizes a service processor, various computer devices, and at least one central checkstop collection location. The occurrence of the checkstop at one of the computer devices is detected by its internal checkstop operation. The occurrence of the checkstop is driven to the at least one central checkstop collection location, all other of the computer devices, and the service processor. A single-wire checkstop provides a way for all chips of the entire computer system to be halted when the occurrence of the checkstop has been detected. Error registers of the chips are then queried via a separate JTAG to identify the chip which first pulled checkstop and what caused the error. The service processor captures the state of the entire computer system at the time of checkstop occurrence and determines the initial source of the checkstop by tracing back from the central checkstop collection chip.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIGS. 2A and 2B are block diagrams of an example JTAG distribution for the present invention hierarchical JTAG based architecture for a computer system of FIG. 1.

DETAILED DESCRIPTION OF ILLUSTRATIVE EMBODIMENT

Figure 1:
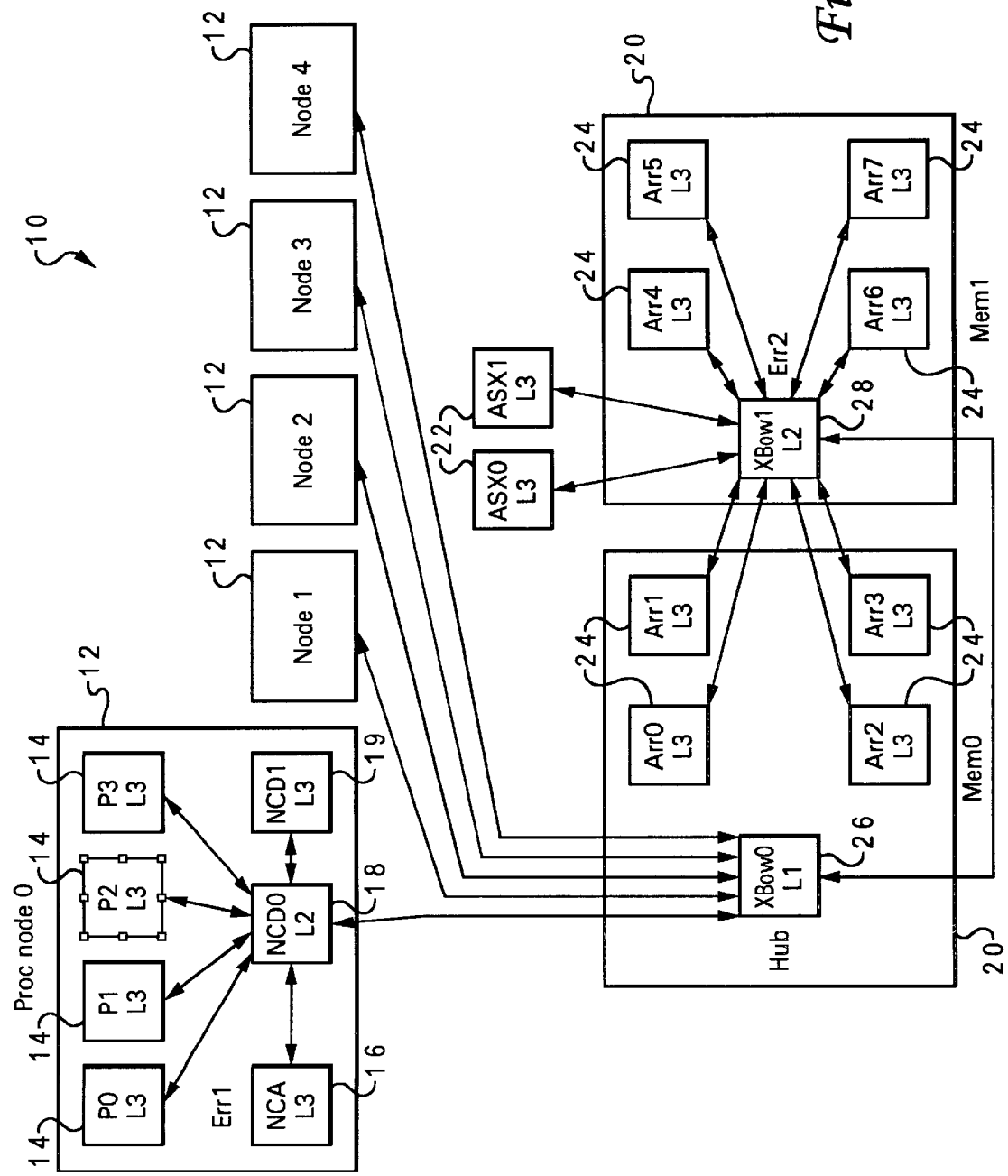
FIG. 1 is a block diagram showing an example of the checkstop hierarchy for the present invention hierarchical JTAG based architecture for a computer system.

The present invention provides a checkstop architecture for an entire and overall computer system, particularly a complex computer system. The checkstop architecture allows the computer system to be promptly or immediately stopped or halted when such a failure(s) or error(s) has occurred within the computer system such as at a chip, component, or sub-system. The present invention provides a way of preserving the state of an entire computer system at failure or error so that a complete and accurate state of the entire computer system at the time of failure or error occurrence is still provided. The present invention also provides an easy way of identifying, locating, and debugging the error(s) or failure(s) that has or have occurred within an overall computer system and the source of the error(s) or failure(s).

The present checkstop architecture allows the entire computer system to be quickly and rapidly stopped or halted. Since other parts of the computer system do not continue to execute, the initial source of error or failure is much easier to spot and the problem is much easier to debug. Also, the state of the system at time of error or failure is preserved so that a complete and accurate state of the computer system is available. A single-wire checkstop provides a way for all chips of the entire computer system to be halted when the occurrence of the checkstop has been detected. Error registers of the chips are then queried via a separate JTAG to identify the chip which first pulled checkstop and what caused the error.

The present checkstop architecture is generally described as follows: Key chips of a complex computer system include bi-directional checkstop logic. When a chip encounters a checkstop condition, it immediately drives out a checkstop signal to all chips attached or coupled to its checkstop lines. The next set of chips will also drive their checkstop line and so on until all chips have recognized the checkstop condition. The initial chip that first recognized the checkstop will load its error registers with specific details of the error including the fact that it encountered the initial checkstop, that is, an internal checkstop. The other chips will log that an external checkstop occurred. This checkstop logic is extremely fast so that all chips recognize a checkstop in just a few clock cycles. This checkstop configuration allows for an accurate picture of the error. If the checkstop logic were slow, then another chip might "see" a problem caused by the same error before the checkstop line was driven and also report that it has encountered the initial error condition. All error registers of each chip are accessible and queried via a JTAG bus. This JTAG architecture and feature allows a separate micro-controller, which is referred to as a service processor ("SP"), to traverse the tree-structure logic of the checkstop and determine which chip initially pulled checkstop and analyze the appropriate registers to determine what occurred to cause the error or failure. The present invention utilizes a special purpose, bi-directional "checkstop" distribution to quickly stop the system, preserve the failure state, and identify the initial source of the failure condition.

Figure 2B:
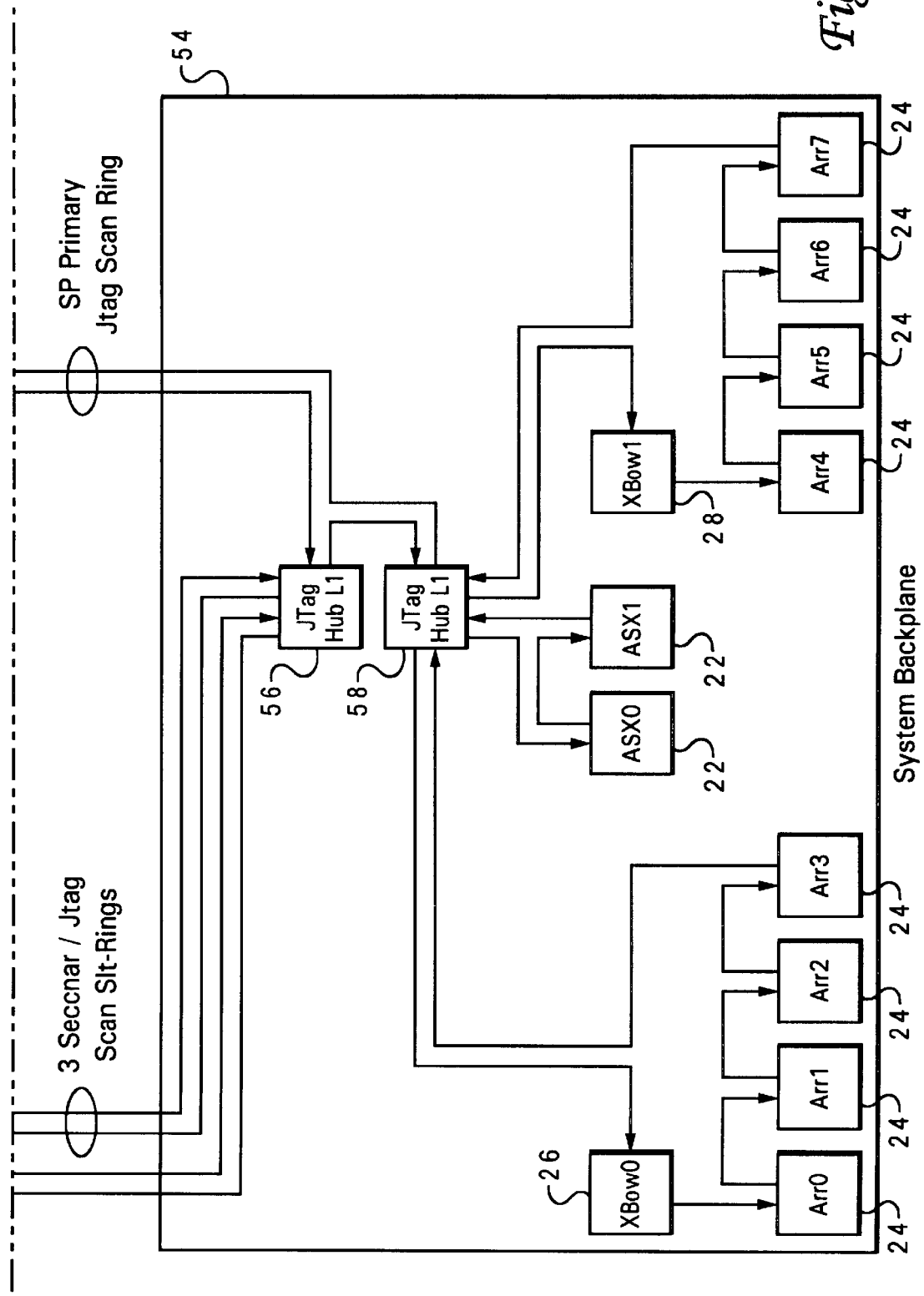

With reference now to the figures and in particular with reference to FIG. 1, a block diagram 10 of the checkstop hierarchy for the present invention hierarchical JTAG based architecture for computer systems is shown. The block diagram 10 shows that the memory controller card (Mem0) 20 and another memory controller card (Mem1) 20, as shown in FIG. 1, are actually on the same card, which is referred to as the system backplane 54 as shown in FIGS. 2A and 2B. The block diagram 10 shows memory controller card (Mem0) 20 interfaced with node processor cards 12 (Node 0, Node 1, Node 2, Node 3, and Node 4 wherein Node 4 is the Native Input/Output (NIO) card) via a crossbow memory controller 26 (i.e. Xbow0 for L1 cache memory) within the memory controller card (Mem0) 20. The processor cards 12 are plugged into machines or computer devices. Each processor card 12 has a number of individual processor chips 14 (P0, P1, P2, and P3) and a node controller data (NCD0) chip 18 to which the individual chips 14 are coupled and in communication. The NCD0 chip 18 is coupled to a node controller address (NCA) chip 16 and another node controller data (NCD1) chip 19.

The memory controller card (Mem0) 20 is further coupled to the other memory controller card (Mem1) 20 as shown in FIG. 1. Each of the memory controller cards 20 has a crossbow memory controller (i.e. XBow0 for Mem0 and XBow1 for Mem1) for handling the address part of the normal operation and a number of memory controllers 24 (Arr0, Arr1, Arr2, Arr3 for Mem0 and Arr4, Arr5, Arr6, and Arr7 for Mem1) for handling the data part of the normal operation. As stated earlier, the crossbow memory controller XBow0 26 is coupled and in communication with the node processors 12, particularly the node controller data (NCD) chip 18 of each of the node processors 12 as shown in FIG. 1. Furthermore, the crossbow memory controller XBow1 28 of the Mem1 is coupled to and in communication with two address controller chips (ASX0 and ASX1) 22. FIG. 1 is a checkstop picture wherein the checkstop logic is dormant until a checkstop occurs. FIG. 1 provides the overall general configuration of the present invention checkstop hierarchy. An example of the checkstop hierarchy will be provided later in the detailed description.

With reference now to the figures and in particular with reference to FIGS. 2A and 2B, a block diagram 30 showing an example JTAG distribution for the present invention hierarchical JTAG based architecture for a computer system of FIG. 1 is shown. The block diagram 30 comprises an input/output (I/O) block 40 for providing connections or interfaces to input or output devices wherein the block 40 provides primary JTAG access, an interface block 32 for the connections or interfaces to the node processor cards 12 (i.e.

Node 1, Node 2, Node 3, Node 4) wherein the block 32 provides a secondary JTAG access, and a backplane block 54 for providing backplane connections or interfaces to the computer system.

The interface block 32 comprises a plurality of individual processor chips 14 (P0, P1, P2, and P3) and a plurality of SRAM memory chips 34. The block 32 also has two node controller data (NCD) chips 18 and 19. The NCD chips 18 and 19 (NCD0 and NCD1) are coupled to a node controller address (NCA) chip 16. The block 32 further has JTAG hubs (for L2 cache memory) 36 and 38. Two of the SRAM memory chip sets 34 and individual processor chips 14 (P0 and P1) are coupled to the JTAG hub (for L2 cache memory) 36 (Eleven (11) SRAM chips actually exist per processor). The JTAG hub 36 is coupled to the NCA chip 16. The I/O block 40 comprises a service processor (SP) 42, an ESP connection 44, JTAG hub (for L1 cache memory) 37, a NCA chip 16, two NCD chips 18 and 19, adapter devices 50 (Colony Adapt0 and Colony Adapt1), and other devices such as Python0, Python1, Midway, Saber0, and Saber1. Various devices, chips, or components, such as Saber0 52, Saber1 52, NCA chip 16, NCD chips 18 and 19 (NCD0 and NCD1), are shown coupled to the Midway device 48. Also, the service processor (SP) 42 and the ESP connection 44 are coupled to the JTAG hub 37. Other various devices, such as Python0 46, Python1 46, Coony Adapt0 50, Coony Adapt1 50, and, of course, Midway 48 are coupled to the JTAG hub L1 37.

The backplane block 54 comprises a JTAG hub (for primary or main memory) 56 and a JTAG hub 58. The JTAG hub 58 is coupled to two address controller chips 22 (ASX0 and ASX1) and to the crossbow memory controller XBow0 26 and the crossbow memory controller XBow1 28. The crossbow memory controller XBow0 is coupled to a number of memory controllers 24 (Arr0, Arr1, Arr2, Arr3), and the crossbow memory controller XBow1 is also coupled to a number of memory controllers 24 (Arr4, Arr5, Arr6, Arr7). The JTAG hub 56 of the back plane block 54 is coupled to the JTAG hub 36 of interface block 32 and the JTAG hub 37 of the I/O block 40. The JTAG hub 56 is coupled to the JTAG hub 58. The JTAG hubs are used to split one JTAG bus into a maximum of four JTAG busses. This splitting allows quicker access to the data in comparison to having one large JTAG chain will all of the chips, components, devices, etc. strung or coupled together.

During JTAG communications, only a single chip is accessed at a time, and all other chips are placed into a bypass mode. This manner of access is standard JTAG protocol. For example, midway 48 does not communicate with Saber1 and Saber0 52 over JTAG. Instead, all chips in a loop except the one being examined are put in the bypass mode. The service processor (SP) 42 can then access error registers in that single chip being examined. In other words, chip-to-chip communication is never done via JTAG.

Referring to FIGS. 1 and 2, an example of the checkstop operation is now discussed. The checkstop operation of any of the chips in FIGS. 1 and 2 is, of course, separate from the primary operations of these chips. In FIG. 1, the crossbow memory controller XBow0 26 is the central collection location or point for all checkstops from all of the chips, components, devices, etc. The crossbow memory controller XBow0 26 also has the primary operation of handling the address portion of the memory control, but it also acts as the primary collection point for the checkstops as well.

For example, a checkstop is triggered by an error, such as a parity error. The memory controller chip Arr4 detects a non-correctable parity error in the primary memory. The parity error is fatal, and the Arr4 chip 24 detects and triggers a checkstop. The detection of the checkstop by the Arr4 chip 24 causes the checkstop to be driven to the crossbow memory controller XBow1 chip 28. The checkstop, in turn, is driven from the XBow1 chip 28 to all attached or coupled chips, processors, devices, components, etc., including the crossbow memory controller XBow0 chip 26. The XBow0 chip 26 drives checkstop to the node controller data (NCD0) chip 18, and the NCD0 chip 18, in turn, broadcasts the checkstop back to the other chips, such as NCA 16, NCD1 19, processor chips 14 (P0, P1, P2, and P3).

Thus, the Arr4 chip 24 will log that an internal checkstop has occurred, and all other chips, processors, devices, components, etc. will log that an external checkstop has occurred. The checkstop is driven to each set of chips, processors, devices, components, etc. The checkstop is so fast that it is recognized by all other chips, processors, devices, components, etc., in just a few clock cycles. The quick and efficient driving of the checkstop allows for an accurate picture and indication of the error or failure. Otherwise, if the checkstop logic and detection were slow, another chip, processor, device, component, etc. may inaccurately indicate that it observed the initial failure and drive its checkstop line.

After the checkstop has been detected and occurred and the checkstop has been broadcast to and recognized by the other chips, processors, devices, components, etc., the service processor (SP) 42 (see FIG. 2) preserves and saves into non-volatile memory the state of the computer system at the time of error or failure. Also, the service processor (SP) 42 reads and queries the error register of the crossbow memory controller XBow0 chip 26 via JTAG, and it determines that from the perspective of the XBow0 chip 26 that the crossbow memory controller XBow1 chip 28 drove the original and first checkstop. The service processor (SP) 42 is able to query the XBow1 chip 28 and determine that the memory controller chip Arr4 24 was the original source of the checkstop where the parity error originally occurred. In other words, JTAG was able to first be used to determine the source of the error, which, in the example, was the Arr4. The source (i.e. Arr4) can then be further queried via JTAG to learn that the failure was a parity error on the bus between the source (i.e. Arr4) and the main memory.

While the invention has been particularly shown and described with reference to a preferred embodiment, it will be understood by those skilled in the art that various changes in form and detail may be made therein without departing from the spirit and scope of the invention.

What is claimed is:

1. A data processing system, comprising:
   one or more processors;
   a memory coupled to said one or more processors;
   a collection of interconnected modules coupled to said one or more processors, said collection including at least first and second modules, wherein said first module, responsive to detection of a condition, transmits a halt signal to all modules in said collection and transmits said halt signal, via said second module, to said one or more processors;
   wherein said second module stores an indication of a module from which said halt signal was received;
   wherein said one or more processors, responsive to said halt signal, query said second module and each successive module in a path coupling said first and second modules until said first module is identified as a source of said halt signal; and wherein said one or more processors stores system status information regarding said collection within said memory.

2. The data processing system of claim 1, wherein said data processing system is a server computer system.

3. The data processing system of claim 1, further comprising:

a Joint Test Action Group (JTAG) bus coupling said one or more processors and said collection of modules.

4. The data processing system of claim 1, further comprising:

means for reloading said system status information from said memory to said collection of interconnected modules to simulate the condition.

5. The data processing system of claim 1, wherein said system status information comprises a state of each module within said collection of interconnected modules when said halt signal was received by each module within said collection of interconnected modules.

6. The data processing system of claim 1, wherein said collection of interconnected modules distribute said halt signal independently of said one or more processors.

7. A method for testing a data processing system, said method comprising:

in response to detecting a condition in a collection of interconnected modules coupled to one or more processors, said collection including at least first and second modules, said first module transmitting a halt signal to all modules in said collection and transmitting said halt signal to said one or more processors via said second module;

storing an indication of a module from which said halt signal was received;

querying said second module and each successive module in a path coupling said first and second modules until said first module is identified as the source of said halt signal; and storing system status information regarding said condition within a memory.

8. The method of claim 7, wherein said data processing system is a computer system, and wherein said storing further comprises storing system status information within a system memory of said data processing system.

9. The method of claim 7, wherein said querying further includes:

querying, using a Joint Test Action Group (JTAG) bus, said second module and each successive module in a path coupling said first and second modules until said first module is identified as the source of said halt signal.

10. The method of claim 7, further comprising:

reloading said system status information from said memory to said collection of interconnected modules to simulate said condition.

11. The method of claim 7, wherein said storing system status information further comprises:

storing a state of each module within said collection of interconnected modules when said halt signal was received by each module within said collection of interconnected modules.

12. The method of claim 7, wherein transmitting said halt signal comprises transmitting said halt signal independently of the one or more processors.

* * * * *